US006706966B2

(12) United States Patent
Browning et al.

(10) Patent No.: US 6,706,966 B2
(45) Date of Patent: Mar. 16, 2004

(54) HARDENED VOYAGE DATA RECORDER

(75) Inventors: Margaret Browning, Bradenton, FL (US); Gregory W. Purdom, Sarasota, FL (US); Andrew Zarling, Nokomis, FL (US)

(73) Assignee: L-3 Communications Corporation, New York, NY (US)

( * ) Notice: Subject to any disclaimer, the term of this patent is extended or adjusted under 35 U.S.C. 154(b) by 152 days.

(21) Appl. No.: 09/899,647

(22) Filed: Jul. 6, 2001

(65) Prior Publication Data

US 2002/0129956 A1 Sep. 19, 2002

Related U.S. Application Data

(60) Provisional application No. 60/277,029, filed on Mar. 19, 2001.

(51) Int. Cl.[7] .................................................. H05K 5/00

(52) U.S. Cl. ....................................... 174/52.1; 206/521

(58) Field of Search ............................... 174/52.1, 52.2, 174/52.3; 206/521, 288, 81, 305; 270/301, 302; 361/679, 688, 730, 752, 795

(56) References Cited

U.S. PATENT DOCUMENTS

| | | |
|---|---|---|
| 2,389,786 A | 11/1945 | Kohn |
| 2,792,274 A | 5/1957 | Ruddock |
| 2,838,360 A | 3/1958 | Murray |
| 3,253,810 A | 5/1966 | Penn |
| 3,268,907 A | 8/1966 | Parrish |
| 3,341,871 A | 9/1967 | Oliveau |
| 3,422,418 A | 1/1969 | Simoneau |
| 3,444,553 A | 5/1969 | Tsumura et al. |
| 3,461,429 A | 8/1969 | Gray |
| 3,634,887 A | 1/1972 | Buchholz |
| 3,662,388 A | 5/1972 | Mott et al. |
| 3,685,009 A | 8/1972 | Fleming, Jr. |
| 3,697,987 A | 10/1972 | Arthur |
| 3,710,313 A | 1/1973 | Kimball et al. |
| 3,717,873 A | 2/1973 | Riggs |
| 3,725,912 A | 4/1973 | Buccholz et al. |
| 3,725,918 A | 4/1973 | Fleisher et al. |

(List continued on next page.)

FOREIGN PATENT DOCUMENTS

| | | |
|---|---|---|
| DE | 36 10 372 | 11/1986 |
| DE | 42 05 216 | 8/1992 |
| EP | 0 550 345 | 7/1993 |
| EP | 0 752 808 | 1/1997 |
| GB | 2151410 | 7/1985 |
| GB | 2 242 304 B | 1/1994 |
| GB | 2 242 330 B | 1/1994 |
| WO | WO 98 47109 | 10/1998 |

OTHER PUBLICATIONS

A publication entitled "Marine Voyage Data Recorders", by Brown et al., published May 3–5, 1999 at the International Symposium On Transportation Recorders.

A publication by Broadgate Ltd. for the VER 3000 Voyage Data Recorder, published in 2000.

Loral Data Systems Brochure entitled "Fairchild Solid State Cockpit Voice Recorder".

*Primary Examiner*—Dean A. Reichard
*Assistant Examiner*—Carmelo Oliva
(74) *Attorney, Agent, or Firm*—Joseph J. Kaliko

(57) ABSTRACT

A hardened voyage data recorder includes two subsystems: a removable non-volatile memory and a base containing electronics and firmware for communicating with data sensing systems and for accessing the memory. According to the invention, the memory is protected in a "boiler" and the electronics includes an ETHERNET interface for connecting to shipboard data acquisition devices. The firmware is preferably configured via web pages. A communications protocol for communicating with the recorder is also disclosed.

30 Claims, 13 Drawing Sheets

U.S. PATENT DOCUMENTS

| | | | | | |
|---|---|---|---|---|---|
| 3,772,692 | A | | 11/1973 | Braddon | |
| 3,833,934 | A | | 9/1974 | Leland | |
| 3,840,874 | A | | 10/1974 | Dawson et al. | |
| 3,869,601 | A | | 3/1975 | Metcalf | |
| 3,889,293 | A | | 6/1975 | Muraco et al. | |
| 3,898,650 | A | | 8/1975 | Jensen | |
| 3,906,370 | A | | 9/1975 | Apps | |
| 3,930,118 | A | | 12/1975 | Midland et al. | |
| 3,971,018 | A | | 7/1976 | Isbister et al. | |
| 4,012,784 | A | | 3/1977 | Murphy | |
| 4,071,898 | A | | 1/1978 | Schorsch et al. | |
| 4,081,802 | A | | 3/1978 | Elmore et al. | |
| 4,159,644 | A | | 7/1979 | Svala | |
| 4,232,391 | A | | 11/1980 | Zanutti | |
| 4,313,115 | A | | 1/1982 | O'Sullivan | |
| 4,334,425 | A | | 6/1982 | Crane | |
| 4,345,462 | A | | 8/1982 | Zanutti | |
| 4,428,052 | A | | 1/1984 | Robinson et al. | |
| 4,446,628 | A | | 5/1984 | Shkolnik et al. | |
| 4,547,778 | A | | 10/1985 | Hinkle et al. | |
| 4,646,241 | A | | 2/1987 | Ratchford et al. | |
| 4,682,292 | A | | 7/1987 | Bue et al. | |
| 4,684,949 | A | | 8/1987 | Kalafus | |
| 4,694,119 | A | | 9/1987 | Groenwegen | |
| 4,729,102 | A | | 3/1988 | Miller, Jr. et al. | |
| 4,835,537 | A | | 5/1989 | Manion | |
| 4,839,656 | A | | 6/1989 | O'Neill et al. | |
| 4,843,575 | A | | 6/1989 | Crane | |
| 4,944,401 | A | * | 7/1990 | Groenewegen | 206/521 |
| 4,991,000 | A | | 2/1991 | Bone et al. | |
| 5,032,896 | A | | 7/1991 | Little et al. | |
| 5,106,520 | A | | 4/1992 | Salyer | |
| 5,123,538 | A | | 6/1992 | Groenwegen | |
| 5,150,279 | A | | 9/1992 | Collins et al. | |
| 5,193,046 | A | | 3/1993 | Lemke et al. | |
| 5,301,089 | A | | 4/1994 | Takashima | |
| 5,317,463 | A | | 5/1994 | Lemke et al. | |
| 5,370,814 | A | | 12/1994 | Salyer | |
| 5,390,083 | A | | 2/1995 | Decker et al. | |
| 5,438,162 | A | * | 8/1995 | Thompson et al. | 174/52.2 |
| 5,452,685 | A | | 9/1995 | Thomas | |
| 5,499,164 | A | | 3/1996 | Hill-Lindsay | |
| 5,706,180 | A | | 1/1998 | Lacroix et al. | |
| 5,708,565 | A | * | 1/1998 | Fairbanks | 361/704 |
| 5,750,925 | A | | 5/1998 | Purdom | |
| 5,756,934 | A | | 5/1998 | Purdom | |
| 5,841,638 | A | | 11/1998 | Purdom et al. | |
| 5,969,953 | A | | 10/1999 | Purdom et al. | |
| 6,153,720 | A | * | 11/2000 | Olzak et al. | 528/182 |
| 6,167,238 | A | * | 12/2000 | Wright | 455/66 |

* cited by examiner

HARDENED VOYAGE DATA RECORDER

This application claims the benefit of Provisional Application serial No. 06/277,029 filed Mar. 19, 2001, the complete disclosure of which is hereby incorporated by reference herein.

BACKGROUND OF THE INVENTION

1. Field of the Invention

The invention relates to apparatus for recording data regarding the operation of a sea borne vessel. More particularly, the invention relates to apparatus for recording and protecting data leading up to an accident or "incident".

2. Brief Description of the Prior Art

It has long been noted that the investigation of maritime accidents and incidents could benefit from the recording of data and audible commands occurring aboard ships. Indeed, many considered this an inevitable technological extension of the time-honored ship's logbook. This desire has culminated in the development of an international standard governing the performance of a Voyage Data Recorder (VDR).

In 1974 the Safety of Life at Sea (SOLAS) Convention of the International Maritime Organization (IMO) acknowledged the value and expressed the desire of having recorders on ships similar to the "black box" flight recorders for aircraft. This began a long process of establishing international standards and requirements for a Voyage Data Recorder (VDR).

In 1996, VDR requirements, which had been debated for a long time, began to emerge in the navigation and electronics subgroup (NAV) of the IMO. Anticipating an eventual IMO resolution concerning VDRs, IEC (International Electrotechnical Commission) TC80 formed WG11, which began structuring a specification based on preliminary drafts of the NAV requirements. The IMO passed resolution A. 861 (20) in November 1997 and the IEC standard 61996 was completed as a Committee Draft for Voting in March 1999. The specification was published in August 2000.

The IEC 61996 Ship borne Voyage Data Recorder Performance Requirements describes data acquisition and storage functions and refers to a "protective capsule" and a "final storage medium". Architecture for complying with this standard has emerged with two major components.

In the first component, the ship's interfaces, data acquisition, and soft recording functions are encompassed in a Data Management Unit (DMU). The DMU is intended for installation in the relatively benign environment of the bridge. The second component is the Hardened Voyage Recorder (HVR) which encompasses the protective capsule and final storage medium. The HVR is designed for survivability and recoverability. It is intended for external installation on the bridge deck or on top of the superstructure.

The primary function of the Hardened Voyage Recorder (HVR) is to protect the data acquired by the Voyage Data Recorder (VDR) so that the data can be used during accident or "incident" investigation.

SUMMARY OF THE INVENTION

It is therefore an object of the invention to provide a Hardened Voyage Recorder which meets or exceeds the requirements of the IEC 61996 test specifications, for the protective capsule and final storage medium.

It is also an object of the invention to provide a Hardened Voyage Recorder which has a substantial storage capacity.

It is another object of the invention to provide a Hardened Voyage Recorder which is capable of recording radar data, audio, and other sensor data.

It is yet another object of the invention to provide a Hardened Voyage Recorder which has a long life and low operating power.

It is another object of the invention to provide a Hardened Voyage Recorder which is easy to install and service.

It is still another object of the invention to provide a Hardened Voyage Recorder which easily interfaces with one or more DMUs.

In accord with these objects which will be discussed in detail below, the Hardened Voyage Recorder (HVR) according to the invention includes two separable subassemblies.

The first subassembly is a mounting base subassembly designed to be directly fastened to the ship and provide a watertight cable entry for power and data connections.

The second subassembly is a removable hardened memory subassembly which is attached to the mounting base with a quick releasing clamp. The hardened memory subassembly has a bracket for an externally mounted underwater location beacon with dual activation moisture sensors to avoid inadvertent activation due to spray, rain, or hosing off. The HVR is preferably painted a highly visible florescent orange with white reflective labels. The reflective labels contain the required text: VOYAGE DATA RECORDER, DO NOT OPEN, REPORT TO AUTHORITIES.

The mounting base subassembly includes electronics for receiving data and writing data to the memory in the hardened memory subassembly.

According to the presently preferred embodiment, the power connection accepts either 110/220 VAC or 24 VDC and the data connection is an ETHERNET connection. The AC and DC power connections may both be active at the same time. The AC connection is preferably used during normal conditions and the DC connection is preferably coupled to the ship's UPS (uninterrupted power supply).

Further, according to the presently preferred embodiment, the HVR receives data via TCP/IP (terminal connection protocol/internet protocol) over ETHERNET. The HVR is therefore assigned an IP address and is configurable via a "web browser". This also enables the formation of a network of multiple HVRs all coupled to numerous sensors via the ETHERNET network.

The removable hardened memory subassembly preferably includes 1.5 gigabytes of solid state memory which is protected in a "boiler" such as that disclosed in co-owned, co-pending application Ser. No. 09/899,646 filed Jul. 6, 2001, the complete disclosure of which is hereby incorporated herein by reference.

DETAILED DESCRIPTION

Figure 1:
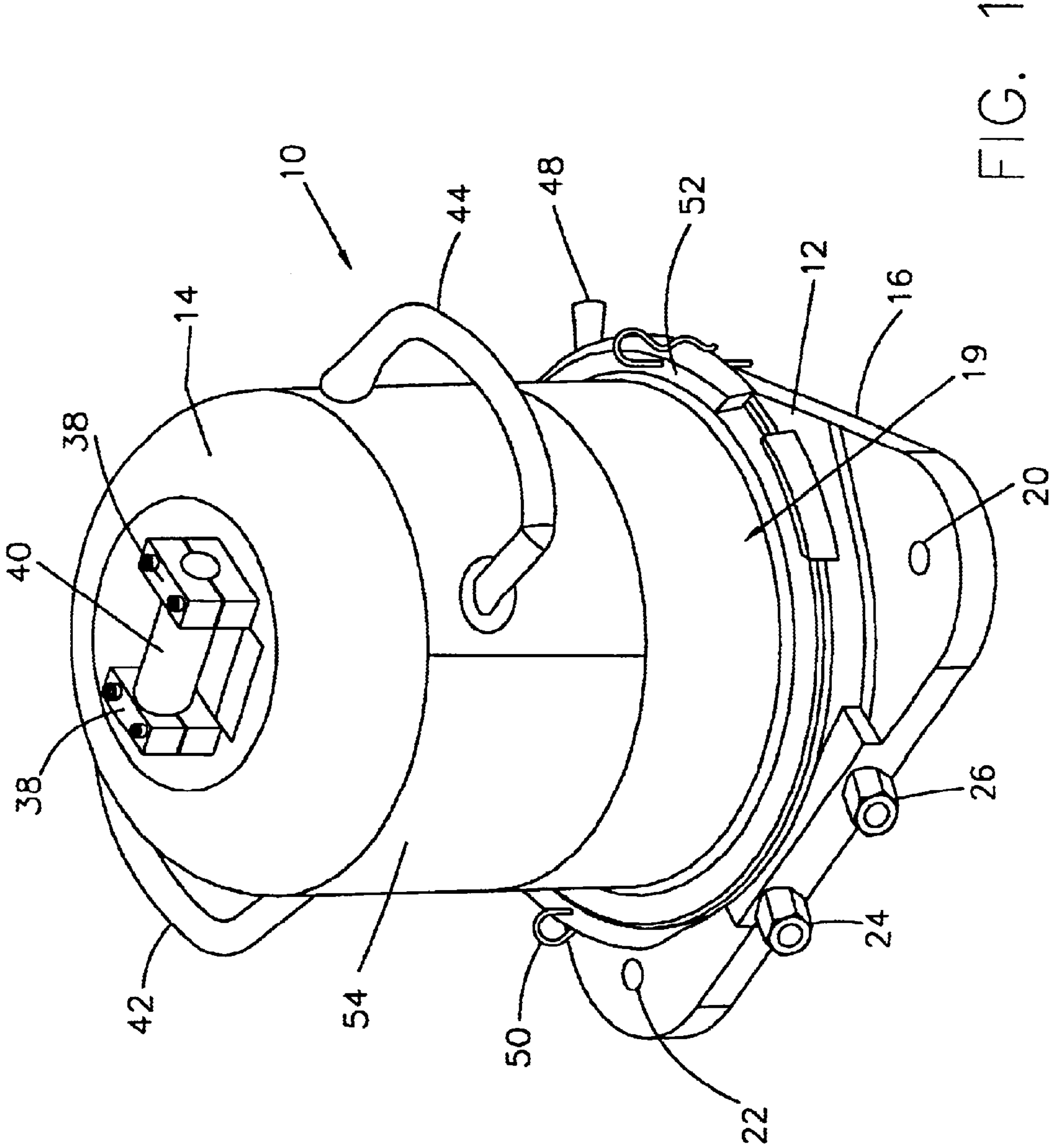
FIG. 1 is a perspective view of an HVR according to the invention.
Figure 2:
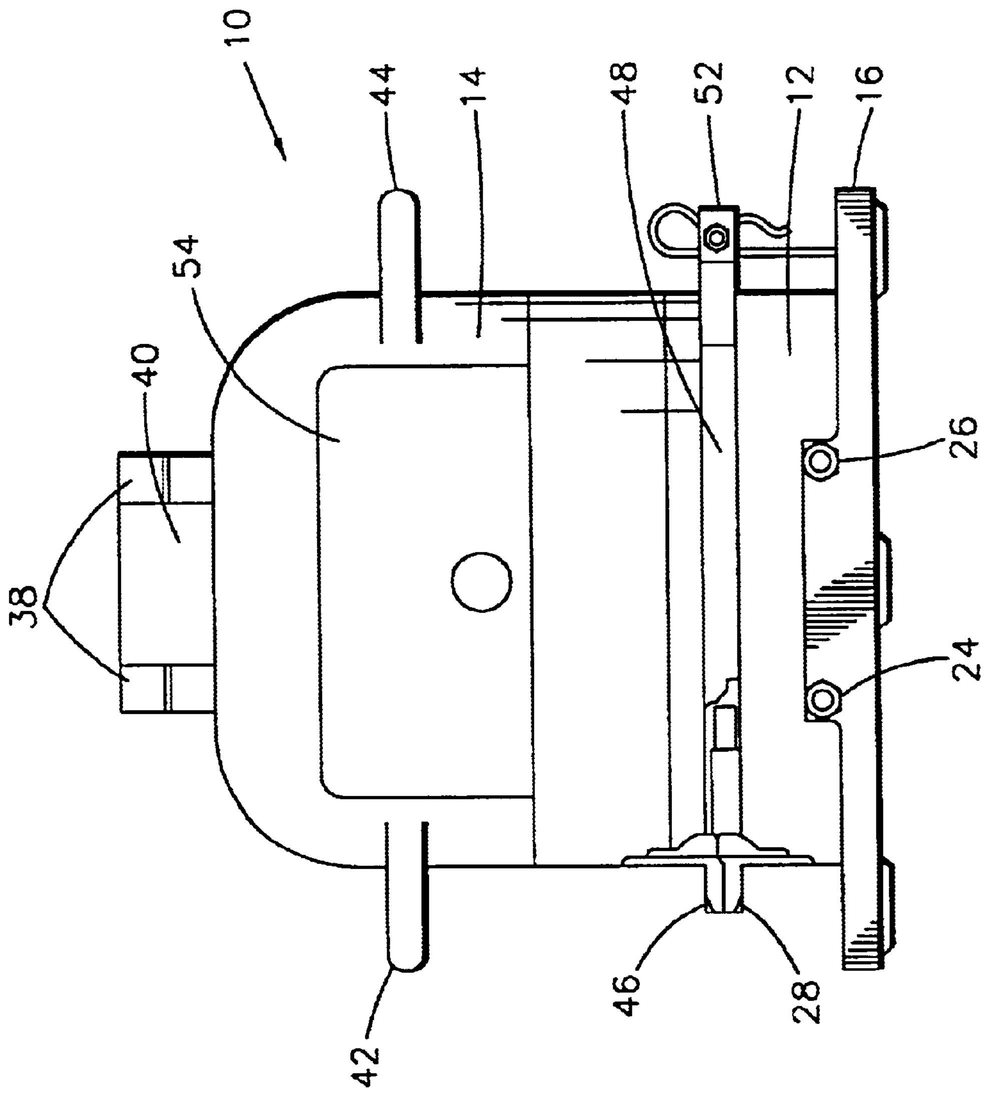
FIG. 2 is a side elevation view of an HVR according to the invention.
Figure 3:
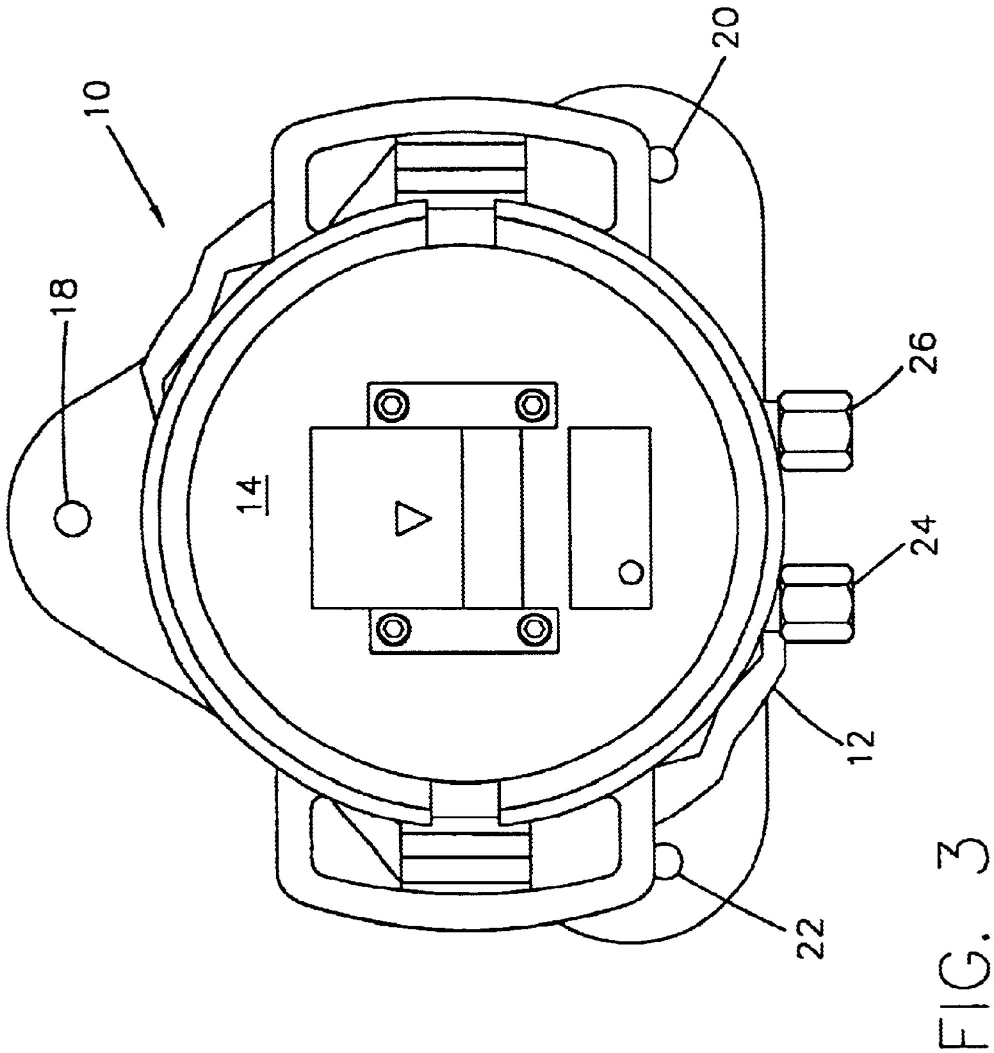
FIG. 3 is a top view of an HVR according to the invention.
Figure 4:
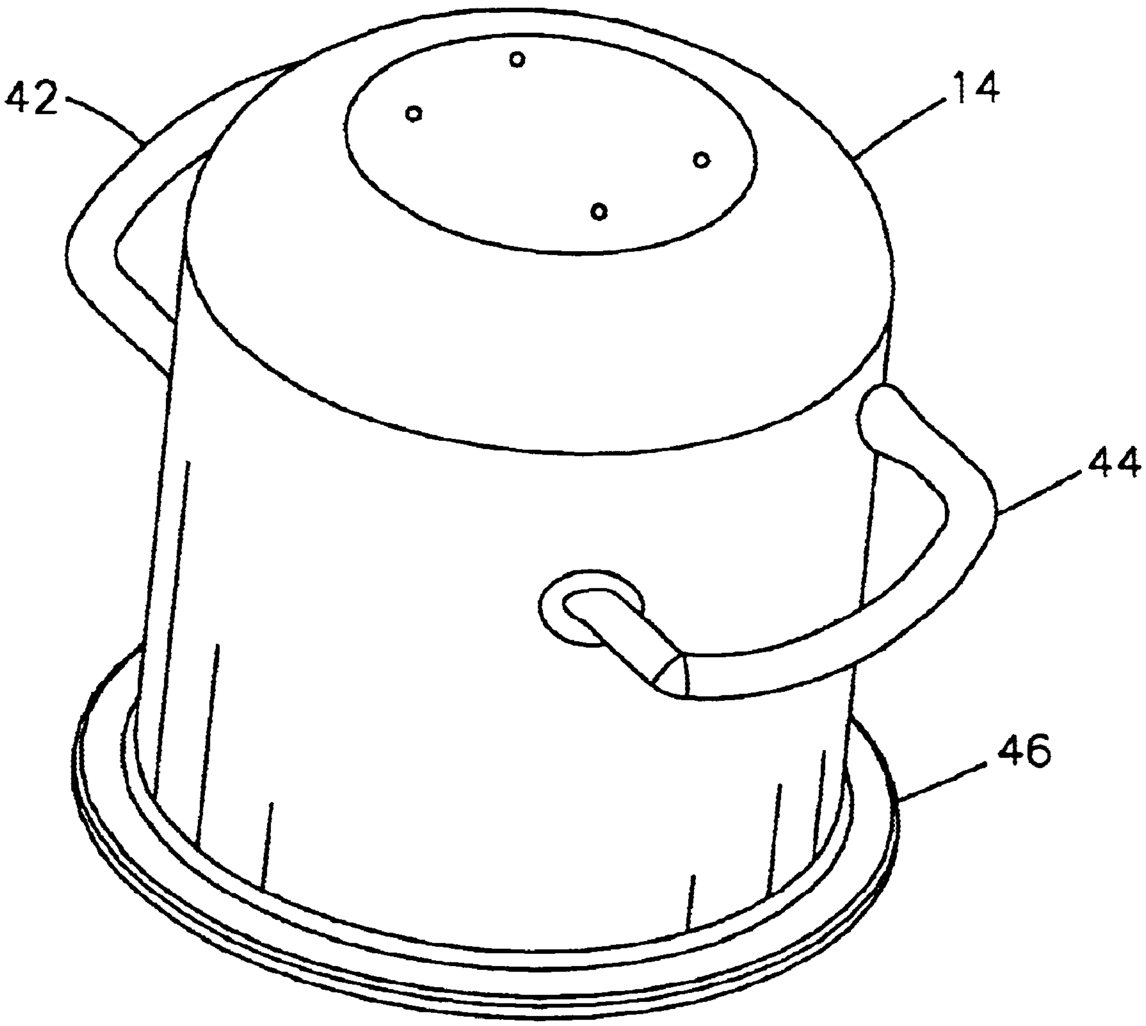
FIG. 4 is a perspective view of the hardened memory subassembly with the beacon bracket removed.
Figure 5:
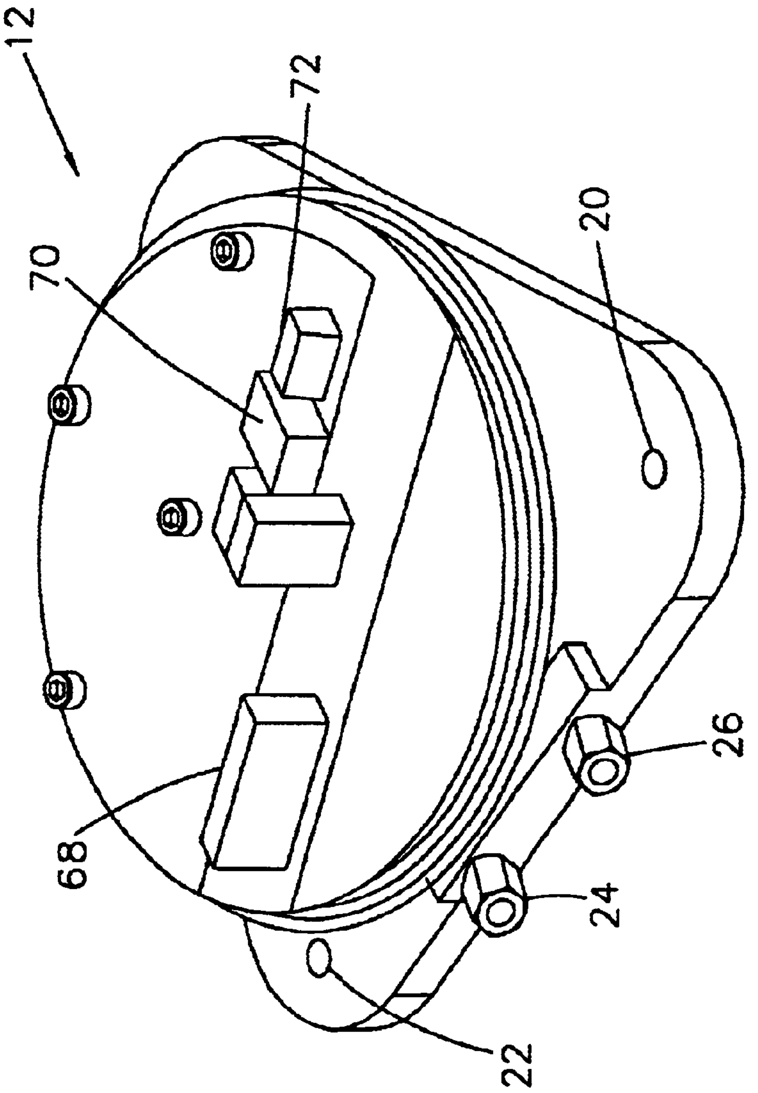
FIG. 5 is a perspective view of the mounting base subassembly.
Figure 6:
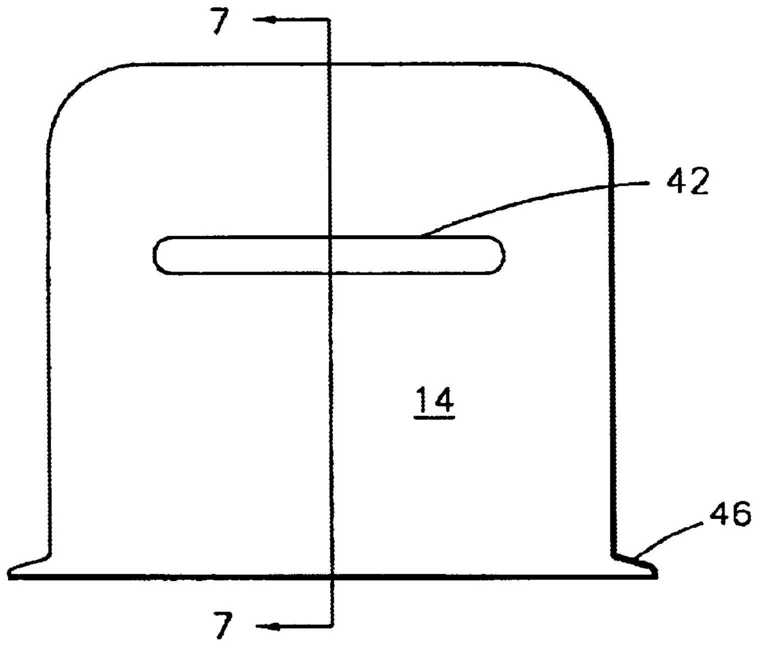
FIG. 6 is a side elevation view of the hardened memory subassembly with the beacon bracket removed.
Figure 7:
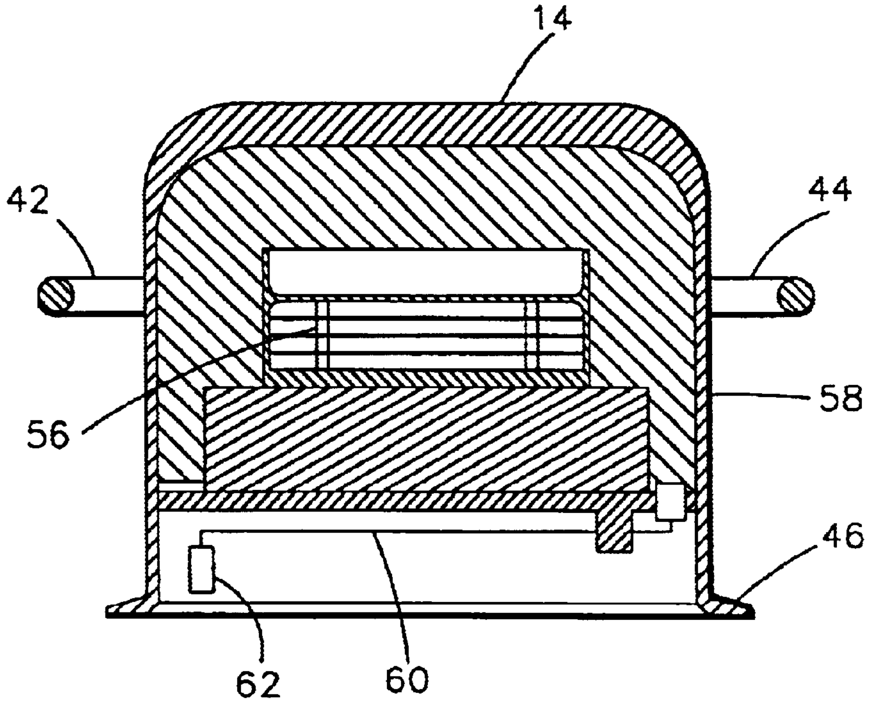
FIG. 7 is a sectional view taken along line A—A in FIG. 6.

Turning now to FIGS. 1–3, the Hardened Voyage Recorder (HVR) 10 according to the invention includes two separable subassemblies. The first subassembly 12 is a mounting base subassembly designed to be directly fastened to the ship and provide a watertight cable entry for power and data connections. The second subassembly 14 is a removable hardened memory subassembly which is attached to the mounting base with a quick releasing clamp.

Figure 8:
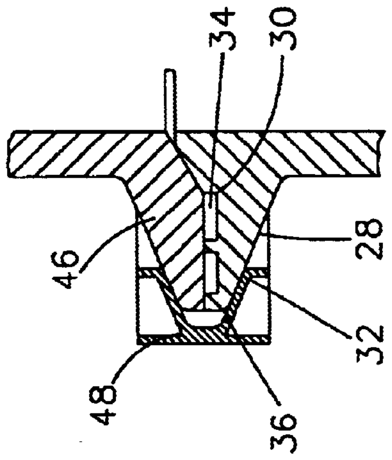
FIG. 8 is a sectional detail of the encircled area of FIG. 2.

Referring now to the mechanical features of the subassembly 12, as shown in FIGS. 1–3, the mounting base subassembly 12 has a lower flange 16 defining three mounting holes 18, 20, 22. Two cable connectors 24, 26 are provided for a watertight coupling of power and data cables (not shown). As seen best in FIGS. 2 and 8–10, the subassembly 12 is also provided with an lower flange 28 which is used to provide a sealing engagement with the removable hardened memory subassembly 14. As seen best in FIG. 8, the upper flange 28 is provided with two concentric grooves 30, 32 which are adapted to receive gasket 34 and o-ring 36. 36 is preferably a rubber o-ring for moisture protection. 34 is preferably a wire mesh for EMI protection.

The mechanical features of the hardened memory subassembly 14 include a bracket 38 for an externally mounted underwater location beacon 40. The beacon is preferably provided with dual activation moisture sensors to avoid inadvertent activation due to spray, rain, or hosing off. The subassembly 14 also has two lifting handles 42, 44 and an upper flange 46 which is used to provide a sealing engagement with the subassembly 12 as seen best in FIGS. 2 and 8.

As shown in FIG. 1, the HVR also includes a V-band 48 having two quick release clamps 50, 52. As mentioned above, the HVR is preferably painted a highly visible florescent orange with white reflective labels, e.g. label 54 shown in FIGS. 1 and 2. The reflective labels contain the required (by IEC 61996) text: VOYAGE DATA RECORDER, DO NOT OPEN, REPORT TO AUTHORITIES. A strip of reflective tape, 19, is shown in FIG. 1, further satisfying the requirements of IEC 61996.

The presently preferred embodiment of the HVR 10 is approximately thirteen inches high and has a diameter of approximately eight inches. The lower flange 16 of the subassembly 12 is substantially triangular and is approximately ten inches per side. The total weight of the HVR is approximately forty one pounds with the base 12 weighing approximately thirteen pounds and the memory subassembly 14 weighing approximately twenty eight pounds.

Before turning to the electronic and software specifications of the subassembly 12, it should be noted that the subassembly 14 includes memory 56 which is protected in a "boiler" 58 such as that disclosed in previously incorporated application Ser. No. 09/899,646.

According to the presently preferred embodiment, electronic access to the memory 56 is provided by a ribbon cable 60 having a (preferably J10) connector 62. The memory is preferably a stacked memory such as that disclosed in previously incorporated application Ser. No. 09/162,001 or in U.S. Pat. No. 5,969,953, the complete disclosure of which is incorporated by reference herein. More particularly, the memory is preferably of the type utilizing "BGA" packaging (ball grid array packages) as memory components.

Referring now to FIGS. 5 and 9–11, the mounting base subassembly 12 includes electronics (partially shown as 64 and 66 in FIGS. 9 and 10) for receiving data and writing data to the memory in the hardened memory subassembly 14.

According to the presently preferred embodiment, the power connection is provided by a terminal strip 68 which accepts either 110/220 VAC or 24 VDC or both. The data connection is an ETHERNET connection which is provided by either an RJ-45 connector 70 or an optional ETHERNET terminal block 72. The AC and DC power connections may both be active at the same time. The AC connection is preferably used during normal conditions and the DC connection is preferably coupled to the ship's UPS (uninterrupted power supply). The maximum power consumption is preferably fifteen watts.

According to the presently preferred embodiment, the stepped down and bridge rectified AC feeds the same storage capacitor that is fed through a diode by the DC, so the higher voltage at the anodes will provide the operating current. IEC 61996 paragraph 4.5.3 requires a two hour reserve uninterrupted power source (UPS).

When connecting the ship's UPS system to the HVR, either the AC or DC input may be used. Clearly the negative terminal of the capacitor and the primary side of the switching power supply are grounded to the DC return. If AC is the only power wired, a 1K Ohm resistor ties this input ground to the AC safety ground. The primaries of the AC input transformer can be strapped in parallel for 115 Vrms or in series for 230 Vrms by means of jumpers on the terminal board (not shown).

Figure 11A:
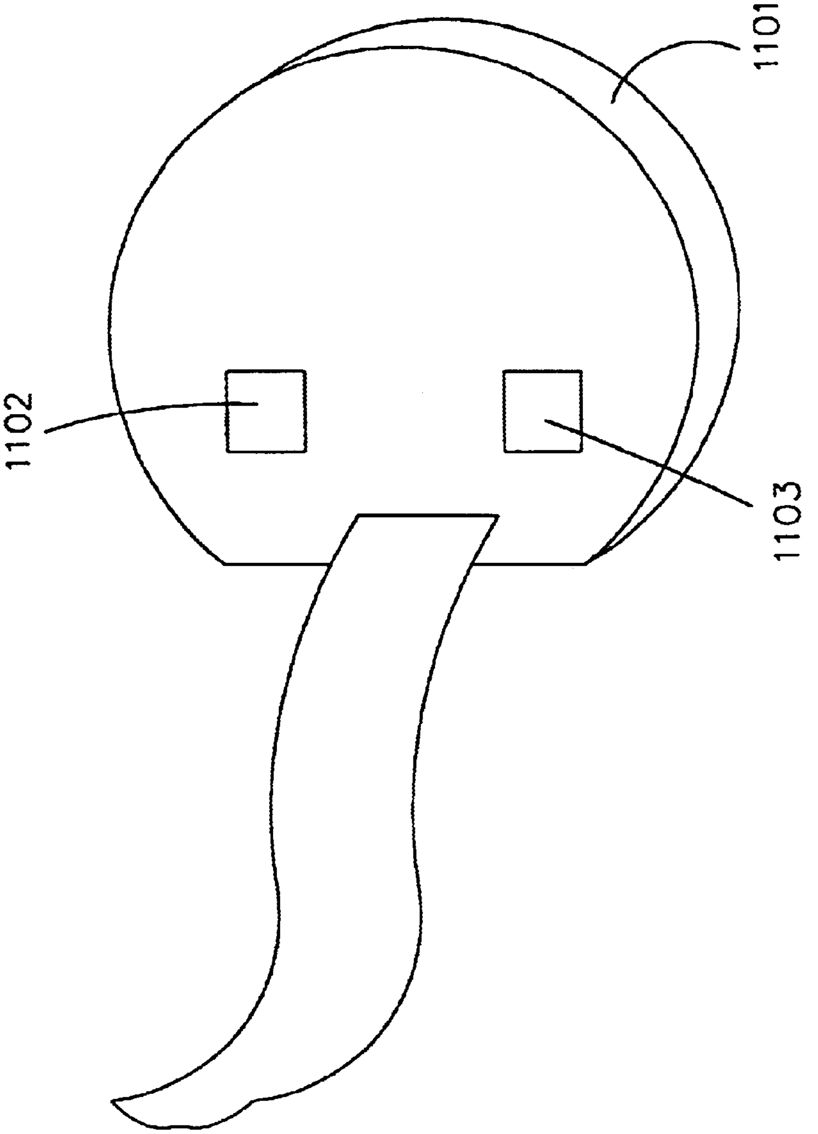
FIG. 11*a* is a perspective view of a stacked memory boards including memory interface converter chips.
Figure 9:
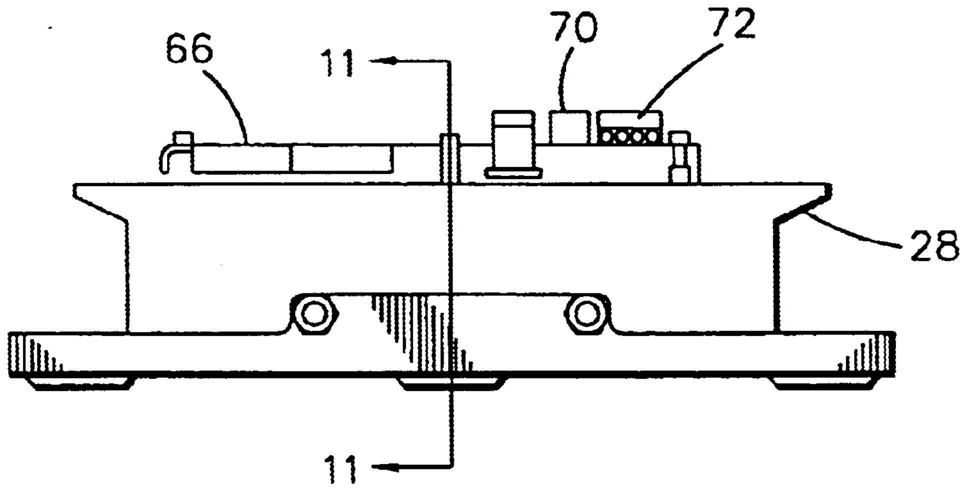
FIG. 9 is a side elevation view of the mounting base subassembly.
Figure 10:
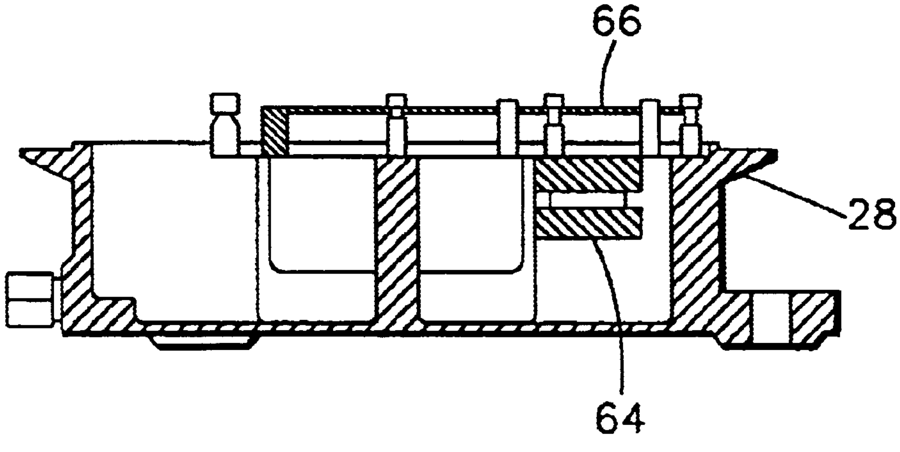
FIG. 10 is a sectional view taken along line B—B of FIG. 9.
Figure 11:
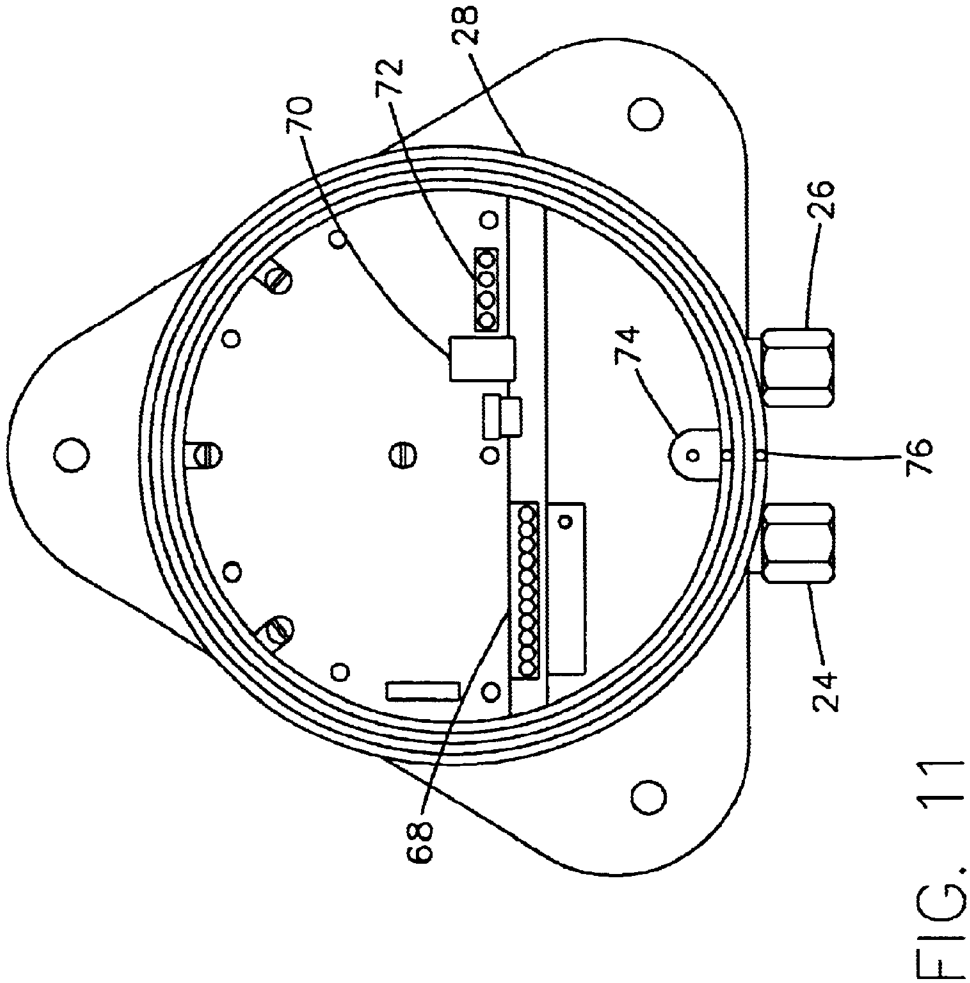
FIG. 11 is a plan view of the mounting base subassembly.

The memory is operated by the DC power from the secondary of the switching transformer, and is isolated from the AC and DC power lines. A secondary ground, which is connected to the case and the ETHERNET shield, must be tied to the hull to prevent voltage difference that could induce corrosion. As shown in FIG. 11, according to a preferred embodiment of the invention, a ground pad 74 is used for grounding. A notch 76 in the upper flange 28 of the subassembly 12 is used to prevent pressure differential in a deep sea pressure environment.

Those skilled in the art will appreciate that the ETHERNET cabling should be shielded to protect it from the expected intense RF fields generated by other shipboard equipment such as radar. The foil shield should end as close as possible to the case after it has passed through the sealing connector 26. The shield's drain wire connects to the ground pad 74 which is located about one inch from the connector 26. Keeping the shield as short as possible inside the case prevents it from re-radiating externally induced signals by using the case as a voltage node. The drain wire at the other end of the ETHERNET cable (at the DMU) should also be grounded to the ship's hull.

As mentioned above, according to the presently preferred embodiment, the memory used in the subassembly 14 is BGA memory. Accordingly, the circuits in the subassembly 14 include one or more MICs (memory interface converter chips) needed to interface (convert between) parallel communications which BGA chips employ and the serial communications path with processor. The MICs need to be able to drive the large number of BGA chips distributed in the preferred stacked memory. The MICs may be located on the circuit board 1101 shown in FIG. 11*a* (MIC chips 1102 and 1103) and/or may be distributed among the memory circuit boards shown in FIG. 11*a*. The processor communicates with the MICs to address memory and the MICs determine which board or stack contains the addressed memory.

Further, as mentioned above, according to the presently preferred embodiment, the HVR receives data via TCP/IP (terminal connection protocol/internet protocol) over ETHERNET. The HVR is therefore assigned an IP address and is configurable via a "web browser". This also enables the formation of a network of multiple HVRs all coupled to numerous sensors via the ETHERNET network.

FIGS. 12–15 illustrate a sample interface to the HVR accessible with any web browser coupled to the ETHERNET network to which the HVR is coupled. Those skilled in the art will appreciate that the ship's ETHERNET network could be connected to the Internet via a satellite link, thus making the HVR available from anywhere in the world.

Figure 12:
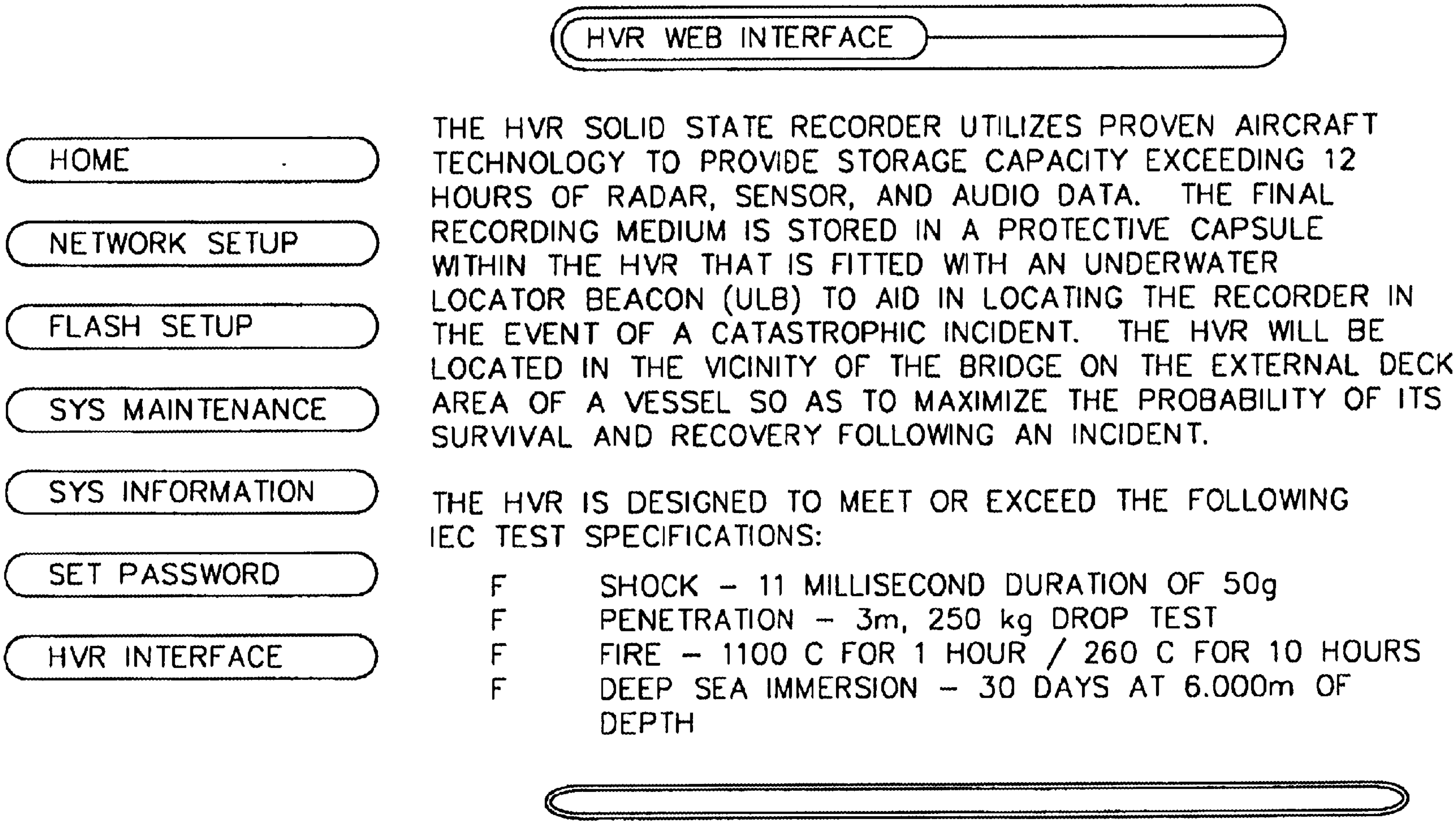
FIG. 12 is a sample "screen shot" of the HVR "home page"
Figure 14:
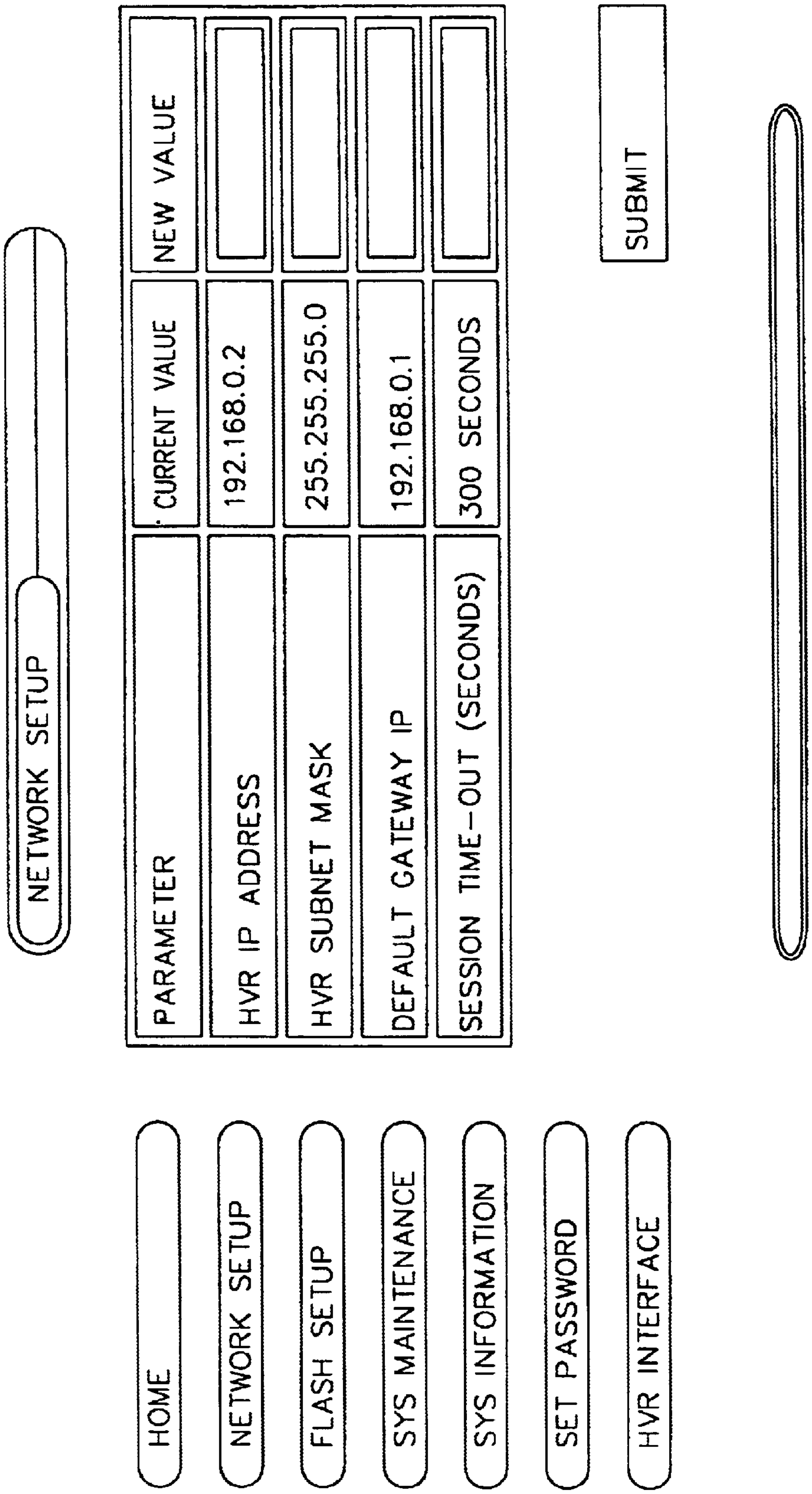
FIG. 14 is a sample screen shot of the HVR network setup page.

FIG. 12 shows a sample HVR homepage. The default URL of the homepage is 192.168.0.2 which is pre-set at the factory but which can be changed as shown in FIG. 14. The homepage Main Menu, provides the main entry point to HVR system configuration setup via a web browser and provides the links for the configuration options. In addition links are available that describe the HVR Interface Details, HVR System Maintenance, and HVR System Information.

The "Network Setup" link shown in FIG. 12 links to the web page shown in FIG. 14 providing a network hostname and IP address setup data entry form.

Figure 15:
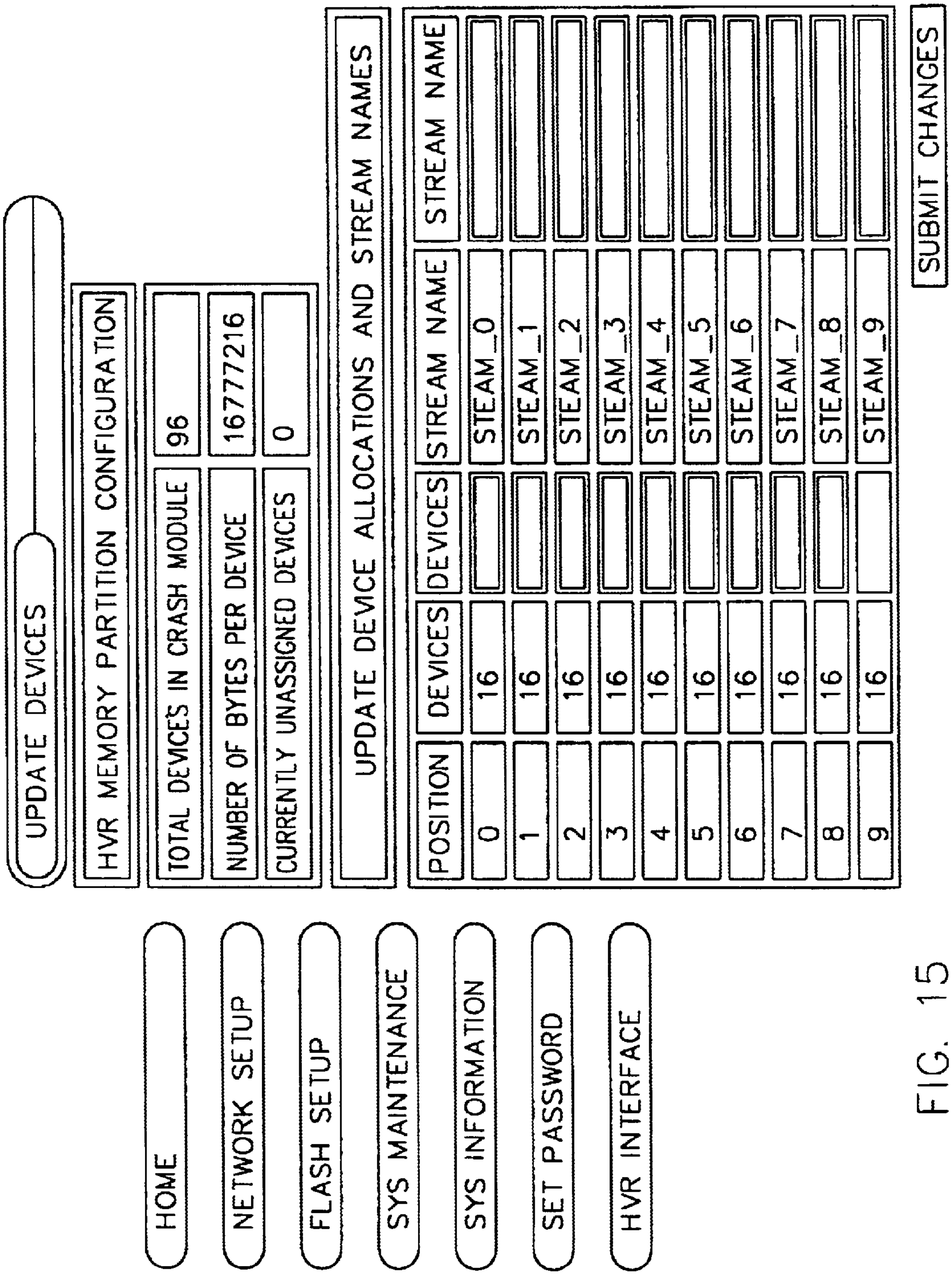
FIG. 15 is a sample screen shot of the HVR device update page.

The "Flash Setup" link shown in FIG. 12 links to a web page shown in FIG. 15 providing a memory partition setup data entry form.

The "Sys Maintenance" link shown in FIG. 12 links to a web page (not shown) listing the existing Flash Memory Setup.

The "Sys Information" link shown in FIG. 12 links to a web page (not shown) providing specific HVR software and IP address information.

The "Set Password" link shown in FIG. 12 links to a web page (not shown) providing a password setup data entry form.

The "HVR Interface" link shown in FIG. 12 links to a web page (not shown) providing HVR system interface information.

Figure 13:
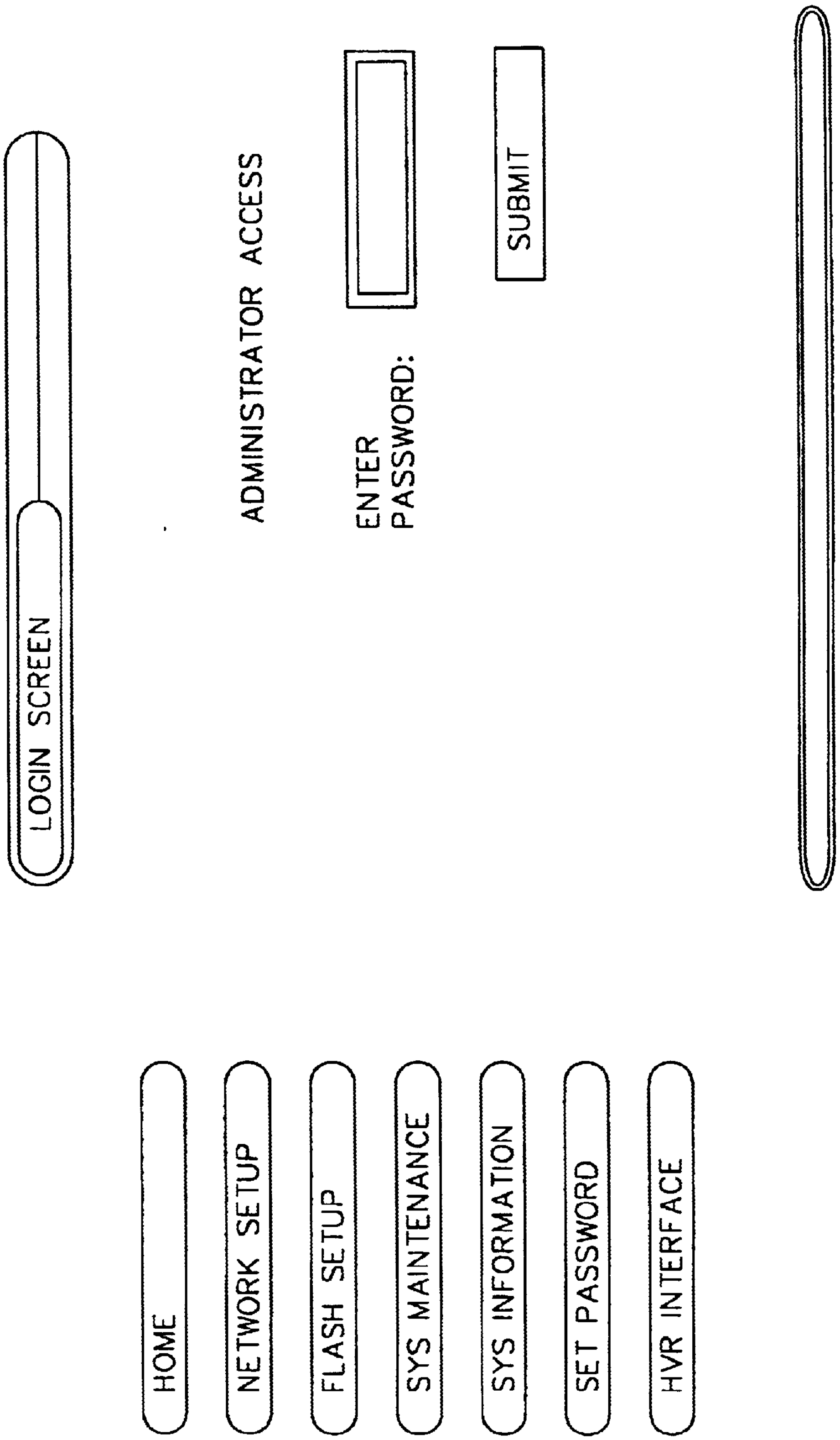
FIG. 13 is a sample screen shot of the HVR login page.

The main menu shown in FIG. 12 can be accessed without entering a password, but in order to change any HVR system configurations, a password is required to be entered via the password entry page shown in FIG. 13. In particular, a password is required to access the Network Setup, Flash Setup, and Set Password pages. Access to any of these pages times out when idle for 300 seconds (which is configurable as shown in FIG. 14) and a password must be re-entered to continue with HVR setup modifications.

The Login Screen of FIG. 13 will appear no matter which system configuration button is selected first.

The HVR is shipped from the factory with the following default IP settings:

IP address: 192.168.0.2

Subnet Mask: 255.255.255.0

Default Gateway IP: 192.168.0.1

Those skilled in the art will appreciate that these are the default settings commonly used with "web-accessible" devices. The "192.168. x.x" IP address scheme is part of a "reserved" block of addresses intended strictly for networks that are not connected to the Internet. When using addresses of this type, the host computer must be configured to an address in this range in order to "see" the HVR and access the HVR's Web pages.

By selecting the Network Setup link in FIG. 12, the user is taken to the page shown in FIG. 13 requiring a password entry. The default password for the HVR is "L3HVR". Upon entering the correct password, the user will be taken to the page shown in FIG. 14 where the network parameters can be set as required. Changes made will not take effect until the HVR is powered down and back up. Once the settings have been made, the HVR can be connected to the VDR network where it should respond at the configured IP address.

Using the page shown in FIG. 15, the user can modify or set up the memory areas used for data storage on the HVR. Each of these areas or partitions require that two parameters be specified: the partition size and the partition name. This page shows the number of currently available memory devices as well as the per device size in Kilobytes. The user partitions and allocates the HVR memory data storage from the available device pool. The configuration of the memory areas requires that the user specify the size of each memory partition in device units, expressed as the number of devices to be allocated to that memory area. The partition size is thus the device size multiplied by the number of devices.

The HVR system internally allocates devices from its internal free pool of devices in order to fill the request. The partition configuration request is processed starting with partition 0 (ZERO) and proceeding to partition 9 (NINE). The partition allocations cannot exceed the number of available devices. Partition allocations are processed until all available devices have been allocated.

The partition name is required during the actual recording of data into a partition. The partition/stream name is to be used by the client application wishing to establish a data connection to the HVR for the storage of data to a particular partition. The connection set up for a data stream requires the partition name. The VDR must use the same partition (stream) name established during the HVR memory configuration in order to establish communication with that partition (stream).

Once the HVR has been configured, it appears to the outside world as a smart interface to a "pool" of nonvolatile memory. Application programs running on one or more data acquisition systems coupled to the ship's network can utilize the pre-allocated memory partitions for storage and retrieval purposes. Each stream partition is treated as a virtual storage loop in which new data continuously overwrites the oldest data in the partition. The HVR processor keeps track of the current write location in the virtual loop for each partition and preserves this through power cycles in nonvolatile storage.

In order to store data in a previously allocated partition, or retrieve data from such a partition, software on the client acquisition system must "open" a TCP/IP Socket Connection to the Data Acquisition Server in the HVR. This Server accepts Socket Connections at Port 5000 of the IP Address assigned to the HVR. Once a connection has been made to the HVR Data Acquisition Server, the acquisition software sends a command which identifies the target partition and the requested operation. The partition is identified by using the name that was specified for the stream during the configuration of the memory pool.

The partition stream can be opened for read or write access, or to request "write status" information. Once the socket connection has been established, and the appropriate command issued, data is sent or received over the Socket Connection. The HVR Data Acquisition Server will accept simultaneous socket connections from multiple client processes as well as multiple socket connections from a single client process. This automatically results from the Client-Server model of the "Berkely Software Distribution" socket interface that is used by the HVR. There are, however, some limitations imposed by the HVR software itself.

Specifically, there can be only one active "Write" client connection associated with a particular Stream Partition. The HVR does, however, support simultaneous reading from Partitions while writing. The "status query" is supported on a Stream regardless of whether or not there is an active "Read" or "Write" connection on that partition.

The application layer above TCP/IP is the functional interface between a client data acquisition subsystem and the HVR. It is assumed that the lower protocol layers ensure error-free and timely delivery of messages in both directions. Furthermore, an ETHERNET HVR interface with TCP/IP layers does not rule out multiple concurrent Users of the HVR. Bandwidth of the storage media and communications channels are, of course, issues which must be considered at the system level.

All messages sent to the HVR begin with a single byte message length value. This represents the number of bytes (characters) in the remainder of the message. For example, the message for opening a partition named "VDR_Radar" for writing would consist of a byte value of 0×0B (11 characters in the remainder of the message), followed by the ASCII characters: WVDR_Radar, followed by a Null terminator (byte value 0×00). Note that the Partition Name, "VDR_Radar" is a 9-character ASCII sequence which is to be followed by a Null terminator character. Along with the 'W' character (for writing) that precedes the Partition Name, the total length of the message is 11 characters. There should be no additional spaces within the message. The "count" byte can be thought of as a specification of exactly how many more characters will be following in order to complete the message. Since the "count" specification is a single byte, the maximum message length is 255 characters.

Certain HVR messages can include one or more optional arguments. In all cases the optional arguments follow the Null terminator of the base message string. Each argument is, itself, a Null-terminated ASCII string. Numerical values contained in optional arguments are ASCII decimal strings. An example of an optional argument which includes a decimal value would be one which limits the amount of data to be sent by the HVR in response to the "Read from Stream" command.

In this case, the added argument might be the string "X25". The 'X' character indicates that this is the "Xfer Count" (transfer count) argument, and the "25" is a two-character ASCII-decimal value which represents 25 Mbytes. The "X25" string represents four additional bytes of the complete command (there must be a Null terminator), and would be so reflected in the message length byte that precedes the base message string. It is essential that the base message string, and each optional argument string be followed by a Null terminator byte. There are some optional arguments that consist of a single ASCII character, and these too must be followed by the Null terminator byte.

Since the message length byte that precedes a request message tells the HVR exactly how many additional bytes must be consumed from the Socket stream in order to obtain the request, that byte must reflect all of the strings and their associated Null terminators. Otherwise the HVR will not "consume" the entire message before attempting to interpret it.

The "Write to Stream" command is sent by the acquisition system as the first data on a successfully opened TCP/IP Socket Connection. This command consists of an upper or lower-case 'w', followed by the Stream Name that was specified when the stream partition was allocated, followed by a zero value to terminate the Stream Name string. Note that the command must be preceded by the "count byte" as described above.

If the HVR processor finds this to be a valid Stream Name, it will reply with a single character response of 'G'. If there is a problem with the attempt to establish the "write" connection, one of several error responses will be sent. Once the acquisition client has received a 'G' response, it can begin to send data on the open socket connection stream.

Optional arguments for the "Write to Stream" command are: "N", for "No Wrap" mode, and "R" for "Reset Write Indices". Neither option takes any additional parameters.

The "No Wrap" option causes the HVR to first reset the Write location to the start of the Partition before beginning to store any data, and also to stop writing to the specified Stream when the end of the Partition is reached. This is primarily useful in testing the integrity of a Partition.

The "Reset Indices" option causes the Write location to be reset to the start of the Partition before beginning to store any data. This does, however, allow writing to "Wrap" when the end of the Partition is reached. This is also intended as a "test" feature.

The "Read from Stream" command is sent by the acquisition system as the first data on a successfully opened TCP/IP Socket Connection. This command consists of an upper or lower case 'r', followed by the Stream Name that was specified when the stream partition was allocated, followed by a zero value to terminate the Stream Name string. Note that the command must be preceded by the "count byte" as described above.

If the HVR processor finds this to be a valid Stream Name, it will reply with a single character response of 'G'. If there is a problem with the attempt to establish the "read" connection, one of several error responses will be sent. Once the acquisition client has received a 'G' response, it can begin to read data from the open socket connection stream.

Optional arguments for the "Read from Stream" command are: "N", for "No Wrap" mode, "O" for specifying an "Offset" in Mbytes at which the Reading should begin, and "X" for specifying the total number of Mbytes to be sent by the HVR.

The "N" option is the counterpart of the "No Wrap" option that is available on the "Write to Stream" command. This option causes the HVR to begin reading at the top of the Partition, and stop reading when the end of the Partition is reached. This is typically used to verify the content of a partition that was filled, for test purposes, using the "N" option on the "Write to Stream" operation.

The "O"" and "X" options are similar in that they are both followed by an ASCII-decimal value that represents a number in Mbytes. The "O" option represents a backwards offset, relative to the current Write location, at which the reading of data from the Partition is to begin. This is a positive value expressed in Mbytes.

For example, an argument of "O15" would back up by 15 Mbytes from the current Write location. That is, it would set the Read pointer back at the data that was stored 15 Mbytes ago. There are some constraints associated with this option.

For example, if a value is specified which is larger than the Partition storage area, then the Read location remains at the current Write location. Also, if the Partition has not been "filled" since the last time the Write location was reset, then the offset will not be adjusted backwards beyond the top of the Partition. This is because data which "follows" the current Write location is meaningless.

The "Status Query on Stream" command is sent by the acquisition system as the first data on a successfully opened TCP/IP Socket Connection. This command consists of an upper or lower case 's', followed by the Stream Name that was specified when the stream partition was allocated, followed by a zero value to terminate the Stream Name string. Note that the command must be preceded by the "count byte" as described above.

If the HVR processor finds this to be a valid Stream Name, it will reply with a single character response of 'G'. If there is a problem with the attempt to establish the "status query" connection, one of several error responses will be sent. If the 'G' response is received, it will be followed by a "Status Response" message which conforms to the message format described for commands to the HVR. That is, the remainder of the response will consist of a "count byte" followed by a Null terminated string. The string will be of the form: "L:n T:n".

Note that the quotes are NOT part of the response, but are shown to emphasize that the entire response is an ASCII, Null terminated string. The letter 'n' indicates an ASCII decimal representation of the appropriate error count. The first 'n' value is the "Loop Error Count" and represents the number of write errors that occurred on the current pass through the Stream Partition.

This value is cleared automatically at the start of each pass through the Partition's memory loop. The second 'n' represents the "Total Error Count", and is the accumulated number of errors since the counters were last cleared (manually or as a result of setting up the Partition Map).

The response to the 'W', 'R', or 'S' commands is a single ASCII character. There is no "count byte" or Null terminator.

If the Partition Name is valid and access has been established, the response is a 'G' character. If the Partition Name is not recognized, the response is an 'S' character. If the Partition has no devices allocated to it, the response is an 'E' character. If the Partition is busy (another client is already writing in the Partition), the response is a 'B' character. If the Partition is Out of Service for some other reason (failed devices, etc.), the response is an 'O' character.

Note that the response to the 'S' command is somewhat unique in that it follows the "single ASCII character" form, but if a valid request was made, continues with a "full message" type of response.

The HVR allows only one Client to be writing to a particular Partition at a time. That is, only one 'W' connection will be allowed for each in-service Partition. The HVR will also accept one or more 'R' connections for a Partition, even if there is currently an active 'W' connection. Issues related to the effects of multiple connections on performance (system throughput) must be carefully considered.

The response to a 'W' command, for a Partition that already has an active 'W' connection, is the 'B' message (busy).

The current implementation of the HVR subsystem is capable of data transfer to or from the protected memory store at a rate of around 1.5 Mbits per second (using 10-Base T ETHERNET). That is, a data acquisition host or hosts can send data to the protected memory store, or retrieve data from the store, at approximately this rate, when all other conditions are optimal.

When sending data to the HVR, the maximum rate can only be achieved if at least three partitions are being written to concurrently. This is a consequence of the architecture of the memory devices being used in the protected memory store and the HVR software that manages the devices. That is, the maximum write rate relies on the HVR software being able to continuously manage concurrent writes in multiple devices.

There are essentially two buffers used to process the data. The first is the receipt of data packets into an incoming queue, the throughput of this process is approximately 1.5 Mbits per second. The second is in the processing of those data packets from the incoming queue to the flash devices, the throughput of this process is dependent on how the flash chips are managed/mapped. A write to a flash device is slow, relatively speaking, and the software must wait for a write to complete on a given chip before another write can begin. Therefore, if there is only one partition, the writes are all sequential and the throughput will slow to the rate of the chip write function (which can be chip and temperature dependent).

If however, there are multiple partitions, concurrent writes can occur because the software will be writing to different chips. This effectively increases the throughput by n times, where n is defined by the number of partitions. Since the throughput of the process to receive incoming data packets is approximately 1.5 Mbits per second, the goal of the host computer is to partition the flash devices so that this rate can be achieved. Experimentation has shown at least three to four partitions are required.

The maximum read rate is also around 1.5 Mbits per second, assuming that there is no simultaneous writing. The rate of a chip read function is much faster than the write so even if there is only one read occurring (sequential access to a chip) it can keep up with the rate of the process to receive incoming data packets.

When reading and writing are performed together, the available bandwidth of the HVR will be distributed between the operations in a manner that will vary depending on system dynamics.

There have been described and illustrated herein a hardened voyage data recorder and an example of software for using the recorder over an ETHERNET network. While particular embodiments of the invention have been described, it is not intended that the invention be limited thereto, as it is intended that the invention be as broad in scope as the art will allow and that the specification be read likewise. In particular, the specific arrangement of web pages and the specific communications protocol described herein represent a presently preferred embodiment, but the invention is not limited thereto.

It will therefore be appreciated by those skilled in the art that yet other modifications could be made to the provided invention without deviating from its spirit and scope as so claimed.

What is claimed is:

1. A hardened voyage recorder for use on a marine vessel, comprising:

(a) a first module including a mountable base mountable on the marine vessel and containing electronics for receiving data from data sensors located on the marine vessel and for writing data to a memory module;

(b) a removable memory module removably coupled to said first module, said memory module including (i) an outer housing including an inner cavity for containing a solid state memory;

(ii) a cover for said outer housing;

(iii) a thermal insulator located within said inner cavity defining at least a portion of a second interior cavity, with said solid state memory being located within said second inner cavity; and (iv) a boiler located within said second interior cavity including a containment compartment for containing a thermal mass, a protective compartment within which said solid state memory is located and means for interconnecting said containment compartment and said protective compartment, wherein said means for interconnecting, when open, provides a passageway between said containment compartment and said protective compartment.

2. The apparatus as set forth in claim 1 wherein solid state memory includes BGA memory.

3. The apparatus as set forth in claim 1 wherein said solid state memory is stacked memory.

4. The apparatus as set forth in claim 1 wherein said boiler includes a cover plate which covers said protective compartment, said cover plate defines a through hole spaced apart from its edge, and said solid state memory is coupled to a cable which extends through said through hole.

5. The apparatus as set forth in claim 4 wherein said through hole is substantially circular.

6. The apparatus as set forth in claim 4 wherein said cover plate is press fit to said boiler.

7. The apparatus as set forth in claim 1 wherein said thermal mass includes a phase change material (PCM).

8. The apparatus as set forth in claim 7 wherein said PCM utilizes the energy absorption from vaporization to absorb heat.

9. The apparatus as set forth in claim 7 wherein said PCM is water.

10. The apparatus as set forth in claim 9 wherein said water is contained in a dry material which inhibits the water from freezing or expanding.

11. The apparatus as set forth in claim 10 wherein said dry material comprises sponge, silica, polyacrylamide, calcium silicate or pottery clay.

12. The apparatus as set forth in claim 1 wherein said thermal mass is a dry powder formed by combining water and silica.

13. The apparatus as set forth in claim 1 wherein said thermal mass absorbs shock.

14. The apparatus as set forth in claim 13 wherein said thermal mass is a gel formed by combining water and polyacrylamide.

15. A boiler as set forth in claim 1 further comprising a fusible valve that opens at a predetermined temperature to allow said thermal mass to flow through said passageway.

16. A boiler as set forth in claim 15 wherein said fusible valve comprises at least one thermal vent plug which is released at a predetermined temperature.

17. A boiler as set forth in claim 16 wherein said thermal vent plug comprises wax, paraffin, a bismuth alloy or electrical solder.

18. The apparatus as set forth in claim 11 wherein said cover for said outer housing is coupled to said outer housing with a snap ring.

19. The apparatus as set forth in claim 18 wherein said cover for said outer housing is coupled to said outer housing with two snap rings.

20. The apparatus as set forth in claim 1 wherein said outer housing withstands a penetration of a 100 mm 250 kg projectile at three meters.

21. The apparatus as set forth in claim 1 wherein said outer housing will withstand a 50 g s, 11 ms half sine shock.

22. The apparatus as set forth in claim 1 wherein said outer housing will withstand an immersion of 6,000 meters depth.

23. The apparatus as set forth in claim 1 wherein said solid state memory is protected from temperatures on the order of 260° C. for approximately ten hours.

24. A hardened voyage data recorder, comprising:

(a) a removable memory subsystem having a lover flange;

(b) a mounting base subsystem having an upper flange; and (C) a quick release clamp engaging said upper flange and said lower flange whereby said memory subsystem and said base subsystem are removably coupled to each other.

25. A hardened voyage data recorder according to claim 24, wherein said quick release clamp has two quick release levers.

26. A hardened voyage data recorder according to claim 24, wherein:

said mounting base subsystem includes at least one watertight cable connector.

27. A hardened voyage data recorder according to claim 24, wherein:

said mounting base subsystem includes a first watertight cable connector for coupling with a power supply and a second cable connector for coupling with a data source.

28. A hardened voyage data recorder according to claim 24, wherein:

one of said upper flange and said lower flange has a groove adapted to receive an O-ring.

29. A hardened voyage data recorder according to claim 24, wherein:

said upper flange has two concentric grooves, each adapted to receive an O-ring.

30. A hardened voyage data recorder according to claim 29, further comprising:

one o-ring and one mesh gasket, one disposed in one of said two concentric grooves and the other disposed in the other of said two concentric grooves.

* * * * *